(12) United States Patent
Chang et al.

(10) Patent No.: US 11,688,812 B2
(45) Date of Patent: *Jun. 27, 2023

(54) SEMICONDUCTOR DEVICE WITH TREATED INTERFACIAL LAYER ON SILICON GERMANIUM

(71) Applicant: TAIWAN SEMICONDUCTOR MANUFACTURING CO., LTD., Hsinchu (TW)

(72) Inventors: Chih-Yu Chang, New Taipei (TW); Hsiang-Pi Chang, New Taipei (TW); Zi-Wei Fang, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 57 days.

This patent is subject to a terminal disclaimer.

(21) Appl. No.: 17/338,426

(22) Filed: Jun. 3, 2021

(65) Prior Publication Data

US 2021/0296507 A1 Sep. 23, 2021

Related U.S. Application Data

(63) Continuation of application No. 16/853,602, filed on Apr. 20, 2020, now Pat. No. 11,031,508, which is a
(Continued)

(51) Int. Cl.
*H01L 29/786* (2006.01)
*H01L 21/28* (2006.01)
(Continued)

(52) U.S. Cl.
CPC .. *H01L 29/78696* (2013.01); *H01L 21/26513* (2013.01); *H01L 21/28088* (2013.01);
(Continued)

(58) Field of Classification Search
CPC ......... H01L 29/42364; H01L 29/78696; H01L 21/28185; H01L 21/28202
See application file for complete search history.

(56) References Cited

U.S. PATENT DOCUMENTS 6,444,592 B1 9/2002 Ballantine et al.
6,559,007 B1 5/2003 Weimer
(Continued)

FOREIGN PATENT DOCUMENTS

CN 104081506 A * 10/2014 ......... H01L 29/0847

OTHER PUBLICATIONS

Machine translation, Cheng, Chinese Pat. Pub. No. CN-104081506-A, translation date: Sep. 23, 2022, Clarivate Analytics, all pages. (Year: 2022).*
(Continued)

*Primary Examiner* — Victoria K. Hall
(74) *Attorney, Agent, or Firm* — Maschoff Brennan

(57) ABSTRACT

A method includes following steps. A silicon germanium layer is formed on a substrate. A surface layer of the silicon germanium layer is oxidized to form an interfacial layer comprising silicon oxide and germanium oxide. The interfacial layer is nitridated. A metal gate structure is formed over the nitridated interfacial layer.

20 Claims, 11 Drawing Sheets

Related U.S. Application Data continuation of application No. 15/919,070, filed on Mar. 12, 2018, now Pat. No. 10,629,749.

(60) Provisional application No. 62/593,004, filed on Nov. 30, 2017.

(51) Int. Cl.

| | | |
|---|---|---|
| *H01L 21/265* | (2006.01) | |
| *H01L 21/324* | (2006.01) | |
| *H01L 29/66* | (2006.01) | |
| *H01L 29/06* | (2006.01) | |
| *H01L 29/08* | (2006.01) | |
| *H01L 29/10* | (2006.01) | |
| *H01L 29/423* | (2006.01) | |
| *H01L 29/49* | (2006.01) | |

(52) U.S. Cl.
CPC .. *H01L 21/28185* (2013.01); *H01L 21/28202* (2013.01); *H01L 21/28238* (2013.01); *H01L 21/324* (2013.01); *H01L 29/0653* (2013.01); *H01L 29/0673* (2013.01); *H01L 29/0847* (2013.01); *H01L 29/1054* (2013.01); *H01L 29/42364* (2013.01); *H01L 29/42392* (2013.01); *H01L 29/4966* (2013.01); *H01L 29/66545* (2013.01); *H01L 29/66636* (2013.01)

(56) References Cited

U.S. PATENT DOCUMENTS

| | | |
|---|---|---|
| 6,586,349 B1 | 7/2003 | Jeon |
| 6,764,898 B1 | 7/2004 | En |
| 7,242,055 B2 | 7/2007 | Bojarczuk, Jr. et al. |
| 7,355,235 B2 | 4/2008 | Stemmer et al. |
| 7,704,896 B2 | 4/2010 | Haukka |
| 7,750,418 B2 | 7/2010 | Chudzik et al. |
| 8,597,995 B2 | 12/2013 | Xu |
| 8,766,258 B1 | 7/2014 | Dimitrakopoulos |
| 8,772,116 B2 | 7/2014 | Callegari et al. |
| 8,791,003 B2 | 7/2014 | Triyoso |
| 8,969,878 B2 | 3/2015 | Kim |
| 9,093,530 B2 | 7/2015 | Huang et al. |
| 9,171,929 B2 | 10/2015 | Lee et al. |
| 9,190,266 B1 | 11/2015 | Sardashti et al. |
| 9,196,475 B2 | 11/2015 | Lee |
| 9,214,555 B2 | 12/2015 | Oxland et al. |
| 9,236,267 B2 | 1/2016 | De et al. |
| 9,349,823 B2 | 5/2016 | Choi |
| 9,502,416 B1 | 11/2016 | Kim |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,595,449 B1 | 3/2017 | Jagannathan et al. |
| 9,601,342 B2 | 3/2017 | Lee et al. |
| 9,608,116 B2 | 3/2017 | Ching et al. |
| 10,134,585 B2 | 11/2018 | Sardashti et al. |
| 10,192,963 B2 | 1/2019 | Wang et al. |
| 10,504,795 B2 | 12/2019 | Lee |
| 10,510,889 B2 | 12/2019 | More |
| 10,629,749 B2* | 4/2020 | Chang ............... H01L 21/28238 |
| 11,031,508 B2* | 6/2021 | Chang ............... H01L 29/66545 |
| 11,201,055 B2* | 12/2021 | Fu ...................... H01L 21/28202 |
| 2003/0045080 A1 | 3/2003 | Colombo |
| 2003/0089942 A1 | 5/2003 | Bhattacharyya |
| 2004/0082125 A1 | 4/2004 | Hou et al. |
| 2004/0110325 A1 | 6/2004 | Yoo |
| 2004/0127000 A1 | 7/2004 | Colombo |
| 2005/0017272 A1 | 1/2005 | Yamashita |
| 2005/0048728 A1 | 3/2005 | Kawahara |
| 2005/0112827 A1 | 5/2005 | Anthony |
| 2005/0151184 A1 | 7/2005 | Lee |
| 2005/0224897 A1 | 10/2005 | Chen |
| 2005/0247985 A1 | 11/2005 | Watanabe |
| 2006/0022252 A1 | 2/2006 | Doh |
| 2006/0043479 A1 | 3/2006 | Kimizuka et al. |
| 2006/0043497 A1 | 3/2006 | Kimizuka et al. |
| 2006/0046514 A1 | 3/2006 | Alshareef |
| 2006/0131672 A1 | 6/2006 | Wang |
| 2006/0131675 A1 | 6/2006 | Wang et al. |
| 2006/0261401 A1 | 11/2006 | Bhattacharyya |
| 2006/0292872 A1 | 12/2006 | Haukka |
| 2007/0090471 A1* | 4/2007 | Cartier ............... H01L 29/105 257/411 |
| 2007/0102774 A1 | 5/2007 | Wang |
| 2007/0212896 A1 | 9/2007 | Olsen |
| 2008/0076268 A1 | 3/2008 | Kraus |
| 2008/0242012 A1 | 10/2008 | Pae |
| 2008/0261055 A1* | 10/2008 | Chu ............... H01L 21/76256 428/428 |
| 2009/0026557 A1 | 1/2009 | Yamaguchi |
| 2009/0174013 A1 | 7/2009 | Shimizu |
| 2009/0214767 A1 | 8/2009 | Wang et al. |
| 2010/0052077 A1 | 3/2010 | Hsu et al. |
| 2010/0075507 A1 | 3/2010 | Chang et al. |
| 2010/0246611 A1 | 9/2010 | Sun |
| 2010/0248464 A1 | 9/2010 | Clark |
| 2010/0327366 A1 | 12/2010 | Manabe |
| 2011/0298053 A1 | 12/2011 | Zhong et al. |
| 2012/0012946 A1 | 1/2012 | Yugami |
| 2012/0025326 A1 | 2/2012 | Nakagawa |
| 2012/0129330 A1 | 5/2012 | Kim et al. |
| 2012/0196433 A1 | 8/2012 | Han |
| 2012/0217586 A1 | 8/2012 | Chern |
| 2012/0244670 A1 | 9/2012 | Do et al. |
| 2012/0280288 A1 | 11/2012 | Ando et al. |
| 2012/0319206 A1 | 12/2012 | Bidal |
| 2012/0319211 A1 | 12/2012 | Van Dal |
| 2013/0126986 A1 | 5/2013 | Brodsky et al. |
| 2013/0221413 A1 | 8/2013 | Jagannathan |
| 2013/0256802 A1 | 10/2013 | Divakaruni et al. |
| 2013/0267086 A1 | 10/2013 | Brodsky et al. |
| 2013/0288396 A1 | 10/2013 | Keshtbod |
| 2013/0295758 A1 | 11/2013 | Kim |
| 2014/0054612 A1 | 2/2014 | Domeij |
| 2014/0054726 A1* | 2/2014 | Takenaka ............... H01L 29/51 438/762 |
| 2014/0065841 A1 | 3/2014 | Matero |
| 2014/0073103 A1 | 3/2014 | Won |
| 2014/0151819 A1 | 6/2014 | Cheng et al. |
| 2014/0183652 A1 | 7/2014 | Chern |
| 2014/0252493 A1 | 9/2014 | Frank et al. |
| 2014/0264639 A1 | 9/2014 | Frank et al. |
| 2014/0273381 A1 | 9/2014 | Rim |
| 2015/0021699 A1 | 1/2015 | Ando |
| 2015/0060861 A1 | 3/2015 | Chiu et al. |
| 2015/0076623 A1 | 3/2015 | Tzou |
| 2015/0099315 A1 | 4/2015 | Chen |
| 2015/0194300 A1 | 7/2015 | Kim et al. |
| 2015/0228478 A1 | 8/2015 | Tapily et al. |
| 2015/0303057 A1 | 10/2015 | Lee |
| 2015/0318177 A1 | 11/2015 | Ando |
| 2016/0013107 A1 | 1/2016 | Won |
| 2016/0056033 A1 | 2/2016 | Brand et al. |
| 2016/0064225 A1 | 3/2016 | Kim |
| 2016/0079386 A1 | 3/2016 | Aoki et al. |
| 2016/0133738 A1 | 5/2016 | Chang et al. |
| 2016/0284697 A1 | 9/2016 | Yoon et al. |
| 2016/0329254 A1 | 11/2016 | Ando |
| 2016/0343806 A1 | 11/2016 | Siddiqui |
| 2017/0005175 A1 | 1/2017 | Song |
| 2017/0040159 A1 | 2/2017 | Kachian et al. |
| 2017/0162686 A1 | 6/2017 | Arimura |
| 2017/0186746 A1 | 6/2017 | Chung |
| 2017/0222005 A1 | 8/2017 | Lin |
| 2017/0294519 A1 | 10/2017 | Khan |
| 2017/0309479 A1 | 10/2017 | Yoshida et al. |
| 2017/0358588 A1 | 12/2017 | Ando |
| 2018/0076040 A1 | 3/2018 | Ando et al. |
| 2018/0211885 A1* | 7/2018 | Bao ............... H01L 21/823857 |
| 2018/0277647 A1 | 9/2018 | Yoo |

(56) References Cited

U.S. PATENT DOCUMENTS

| | | |
|---|---|---|
| 2019/0280107 A1 | 9/2019 | Ando et al. |
| 2020/0075778 A1 | 3/2020 | Shih |
| 2020/0083115 A1 | 3/2020 | Lee |
| 2020/0105897 A1 | 4/2020 | Hsu |
| 2020/0176585 A1 | 6/2020 | Young |
| 2022/0310779 A1* | 9/2022 | Kuo .................. H01L 28/92 |

OTHER PUBLICATIONS

X. Min et al., "Effect of Trimethyl Aluminium Surgace Pretreatment on Atomic Layer Deposition Al2O3 Ultra-Thin Fil of Si Substrate", (2005), Chinese Physics Letters, vol. 22, pp. 2418-2421. (Year: 2005).

I. Oh et al., "In situ surface cleaning on a Ge substrate using TMA and MgCp2 for HfO2-based gated oxides", (Apr. 22, 2015), J. Maters. Chern. C, vol. 3, pp. 4852-4858. (Year: 2015).

V. Chobpattana et al., Influence of plasma-based in situ surface cleaning procedures on HfO2/In0.53Ga0.47As gate stack properties:, (Oct. 16, 2013), J. Applied Physics, vol. 114, No. 154108, pp. 1-4. (Year: 2013.

S. Murad et al., "Optimisation and scaling of interfacial GeO2 layers for high-k gate stacks on germanium and exliaction of dielectric constant of GeO2", (Jun. 29, 2012), Solid-State Electronics, vol. 78. pp. 136-140 (Year 2012).

M. Milojevic et al., "Characterization of the 'clean-up' of the oxidized Ge(100) surface by atomic layer deposition", *Nov. 24, 2009), Applied Physics Letters, vol. 95, No. 212902, pp. 1-3. (Year: 2009).

J. Gao et al., "Passivation of Ge Surface treated with trimethylaluminum and investigation of electrical properties of HfTiO/Ge gate stacks" (Apr. 18, 2017), J Mats. Science & Tech., vol. 33, pp. 901-906. (Year: 2017).

* cited by examiner

SEMICONDUCTOR DEVICE WITH TREATED INTERFACIAL LAYER ON SILICON GERMANIUM

CROSS-REFERENCE TO RELATED APPLICATION

This application is a continuation application of U.S. patent application Ser. No. 16/853,602, filed Apr. 20, 2020, now U.S. Pat. No. 11,031,508, issued Jun. 8, 2021, which is a continuation application of U.S. patent application Ser. No. 15/919,070, filed Mar. 12, 2018, now U.S. Pat. No. 10,629,749, issued Apr. 21, 2020, which claims priority to U.S. Provisional Application Ser. No. 62/593,004, filed Nov. 30, 2017, which are herein incorporated by reference in their entirety.

BACKGROUND

Intentionally grown interfacial layer (IL) is used in order to arrange a good interface between the channel region and the gate insulator, especially with high-k dielectrics (e.g. $HfO_2$, $HfSiO_4$, $ZrO_2$, $ZrSiO_4$, etc.), and to suppress the mobility degradation of the channel carrier of metal-oxide-semiconductor field-effect transistors (MOSFETs).

However, when the channel region contains silicon germanium, the formation of IL very often results in dangling bond on the surface of IL. The dangling bond decreases electron mobility at the channel region. One way to remove the dangling bond is to epitaxially grow a cap layer on the channel region. An addition of the cap layer increases the thickness of the channel region, and device dimension has to compromise.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
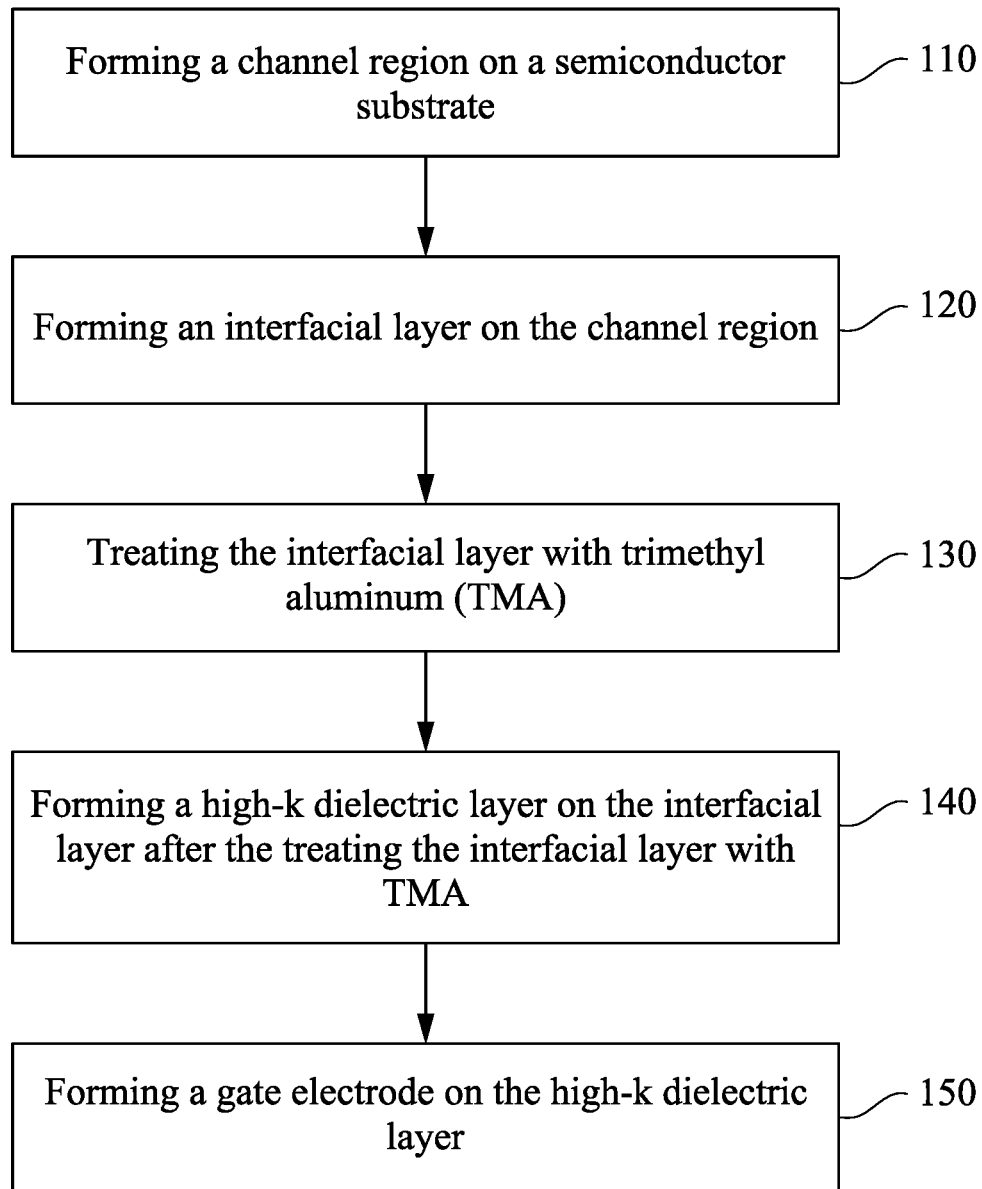
FIG. 1 is a flow chart illustrating a method of fabricating a semiconductor device in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

A metal-oxide-semiconductor (MOS) device and a method of forming the same are provided in accordance with various exemplary embodiments. The intermediate stages of forming the MOS device are illustrated. The variations of the embodiments are discussed. Throughout the various views and illustrative embodiments, like reference numbers are used to designate like elements.

Referring to FIG. 1, a flow chart of a method 100 of fabricating a semiconductor device in accordance with some embodiments of the instant disclosure is shown. The method begins with operation 110 in which a channel region is formed on a semiconductor substrate. The method continues with operation 120 in which an interfacial layer is formed on the channel region. Subsequently, operation 130 is performed. The interfacial layer is treated with trimethyl aluminum (TMA). The method continues with operation 140 in which a high-k dielectric layer is formed on the interfacial layer after the treating the interfacial layer with TMA. The method continues with operation 150 in which a gate electrode is formed on the high-k dielectric layer. The discussion that follows illustrates embodiments of semiconductor devices that can be fabricated according to the method 100 of FIG. 1. While method 100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 2:
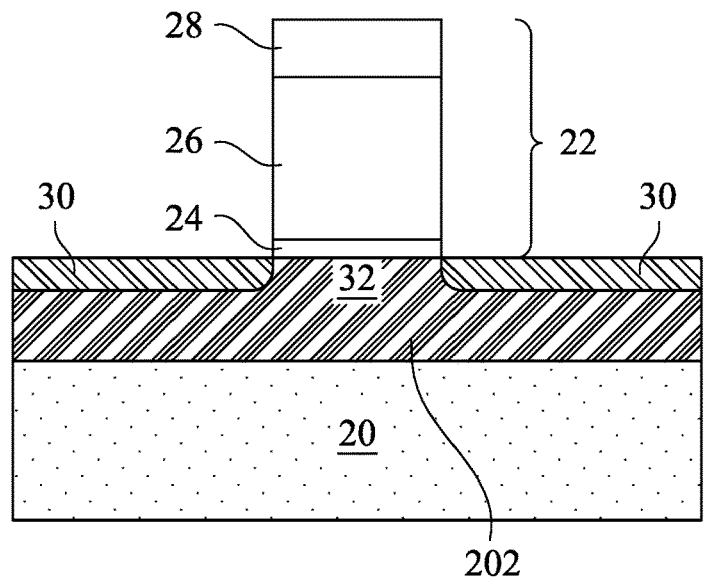
FIGS. 2 through 18 are cross-sectional views of a portion of a semiconductor device at various stages in a replacement gate stack formation process in accordance with some embodiments of the instant disclosure.

FIGS. 2 through 12 are cross-sectional views of intermediate stages in formation of a MOS device in accordance with some exemplary embodiments. Reference is made to FIG. 2. A wafer 10, which includes a semiconductor substrate 20, is provided. A silicon germanium ($Si_{1-x}Ge_x$) layer 202 is formed on the semiconductor substrate 20, and the x ranges between about 0.15 and about 0.95. In the case in which x is smaller than 0.15, the resulting silicon germanium layer has an amount of germanium that is too low to cause an adverse effect. In some embodiments, x may be higher than 0.95, and it indicates a high ratio of $GeO_x$ in the resulting silicon germanium. The $Si_{1-x}Ge_x$ layer 202 is epitaxially grown on the surface of the semiconductor substrate 20. Germanium has a higher lattice constant than silicon, and hence the resulting lattice structure of $Si_{1-x}Ge_x$ layer 202 allows higher electron hole mobility than the semiconductor substrate 20. Shallow trench isolation (STI) regions (not shown) are formed in the $Si_{1-x}Ge_x$ layer 202 and are used to define the active regions of MOS devices.

Reference is still made to FIG. 2. A dummy gate stack 22 is formed over the $Si_{1-x}Ge_x$ layer 202. The dummy gate stack 22 includes a dummy gate dielectric 24 and a dummy gate electrode 26. The dummy gate dielectric 24 includes silicon oxide in some exemplary embodiments. In alternative embodiments, other materials, such as silicon nitride, silicon carbide, or the like, are also used. The dummy gate electrode 26 may include polysilicon. In some embodiments, the dummy gate stack 22 further includes a hard mask 28 over the dummy gate electrode 26. The hard mask 28 may include silicon nitride, for example, while other materials, such as silicon carbide, silicon oxynitride, and the like, may also be used. In alternative embodiments, the hard mask 28 is not formed. The dummy gate stack 22 defines the channel region 32 in the $Si_{1-x}Ge_x$ layer 202. The source and drain regions 38 (FIG. 3) are later formed on opposing sides of the channel region 32.

Reference is still made to FIG. 2. Lightly-doped source and drain (LDD) regions 30 are formed, for example, by implanting a p-type impurity (such as boron and/or indium) into the $Si_{1-x}Ge_x$ layer 202. For example, when the MOS device is a pMOS device, the LDD regions 30 are p-type regions. The dummy gate stack 22 acts as an implantation mask, so that the edges of the LDD regions 30 are substantially aligned with the edges of the gate stack 22.

Figure 3:
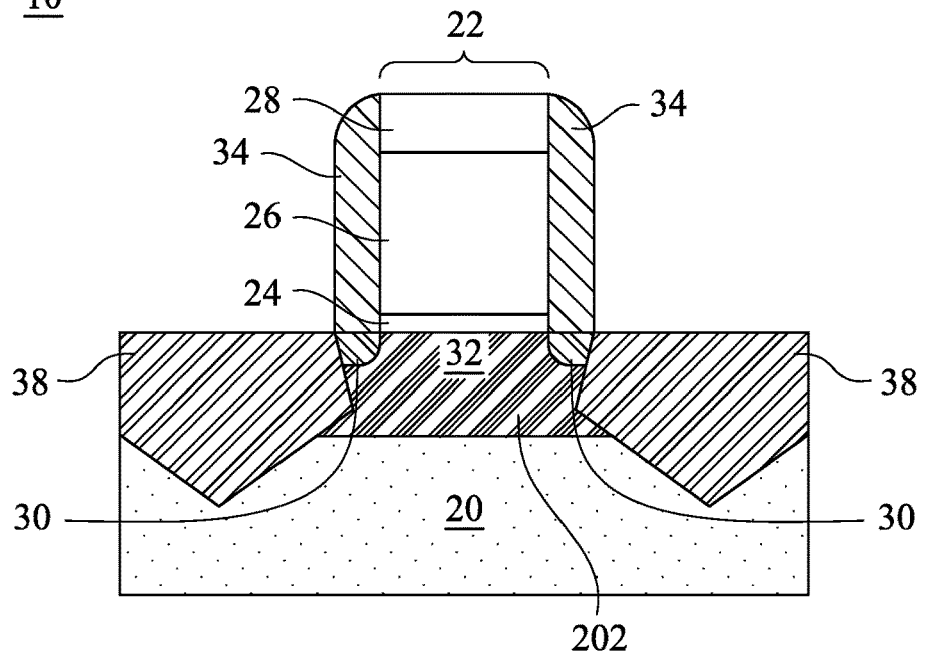

Reference is made to FIG. 3. Gate spacers 34 are formed on sidewalls of the dummy gate stack 22. In some embodiments, each of the gate spacers 34 includes a silicon oxynitride layer and a silicon oxide layer. In alternative embodiments, the gate spacers 34 include one or more layers, each including silicon oxide, silicon nitride, silicon oxynitride, and/or other dielectric materials. Formation methods of the gate spacers 34 include but not limited to plasma enhanced chemical vapor deposition (PECVD), low-pressure chemical vapor deposition (LPCVD), sub-atmospheric chemical vapor deposition (SACVD), and other deposition methods.

Reference is still made to FIG. 3. Source and drain regions (referred to as source/drain regions hereinafter) 38 are formed in the $Si_{1-x}Ge_x$ layer 202. In the embodiments in which the MOS device is a pMOS device, the source/drain regions 38 are of p-type. In some embodiments, source/drain stressors (also marked as 38) are formed in the $Si_{1-x}Ge_x$ layer 202. The source/drain stressors form at least parts of the source/drain regions 38. FIG. 3 illustrates the embodiments in which the source/drain regions 38 fully overlap the respective source/drain stressors.

In the embodiments in which the MOS device is a pMOS device, the source/drain stressors may include suitable dopant. The formation of the source/drain stressors may be achieved by etching the $Si_{1-x}Ge_x$ layer 202 and the semiconductor substrate 20 to form recesses therein, and then performing an epitaxy to grow the source/drain stressors in the recesses.

Figure 4:
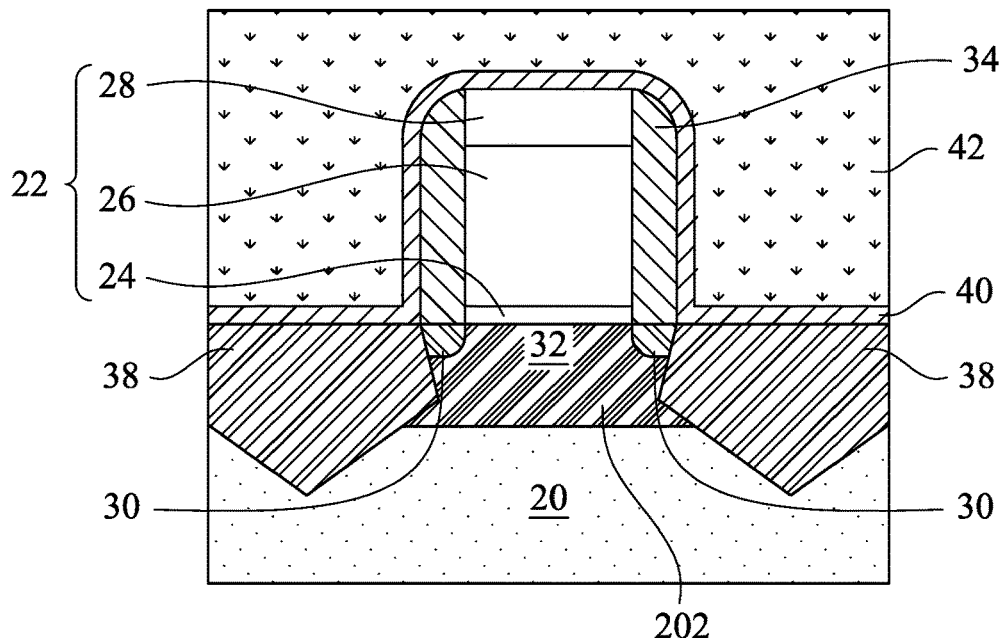

Reference is made to FIG. 4. A contact etch stop layer (CESL) 40 is formed over the gate stack 22 and the source/drain regions 38. In some embodiments, the CESL 40 includes silicon nitride, silicon carbide, or other dielectric materials. An interlayer dielectric (ILD) layer 42 is formed over the CESL 40. The ILD layer 42 is blanket formed to a height higher than the top surface of the dummy gate stack 22. The ILD 42 may include flowable oxide formed using, for example, flowable chemical vapor deposition (FCVD). The ILD layer 42 may also be a spin-on glass formed using spin-on coating. For example, the ILD layer 42 may include phospho-silicate glass (PSG), boro-silicate glass (BSG), boron-doped phospho-silicate glass (BPSG), tetraethyl orthosilicate (TEOS) oxide, TiN, SiOC, or other low-k porous dielectric materials.

Figure 5:
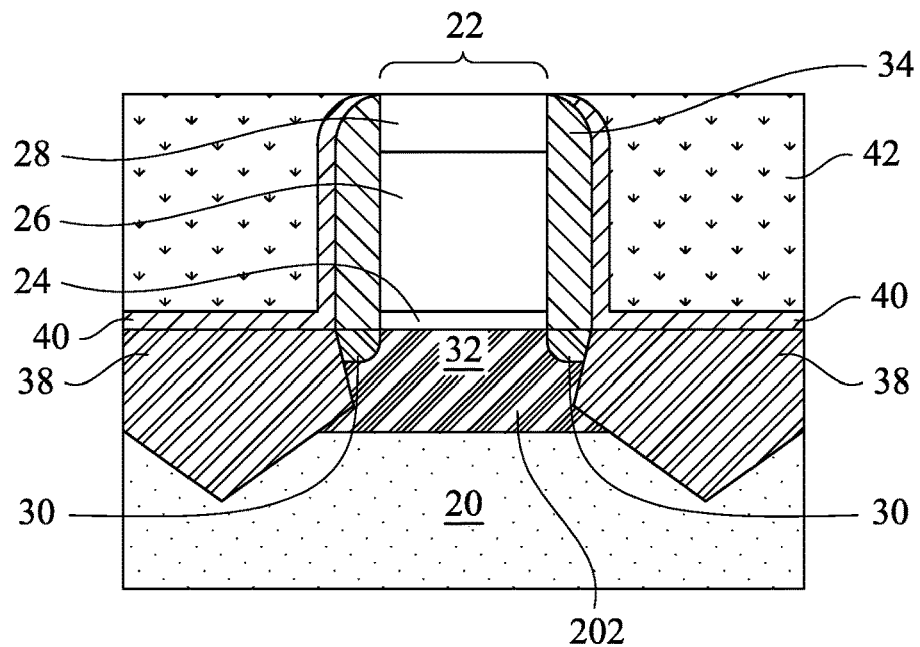

Reference is made to FIG. 5. FIG. 5 illustrates a planarization step, which is performed using, for example, chemical mechanical polish (CMP). The CMP is performed to remove excess portions of the ILD layer 42 and the CESL 40. The excess portions over the top surface of the hard mask 28 are removed. Accordingly, the dummy gate stack 22 is exposed. In alternative embodiments, the hard mask 28 is removed during the CMP, in which the CMP stops on the top surface of the dummy gate electrode 26.

Figure 6:
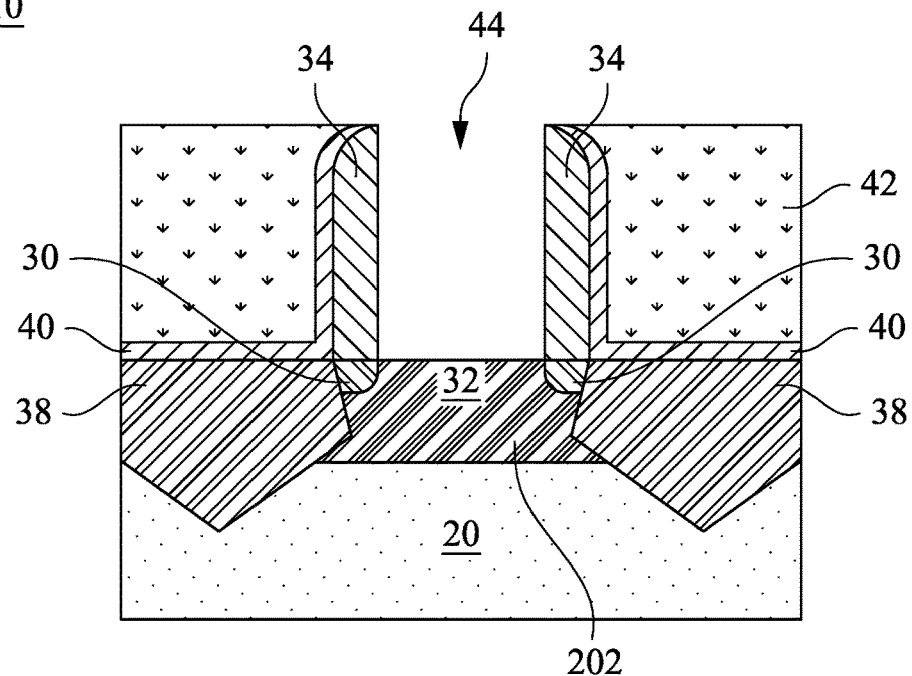

Reference is made to FIG. 6. Next, the dummy gate stack 22 is removed. A recess 44 is formed as a result of the removal of the dummy gate stack 22, in which the resulting structure is shown in FIG. 6. The removal of the dummy gate stack 22 exposes the underlying $Si_{1-x}Ge_x$ layer 202.

Figure 7:
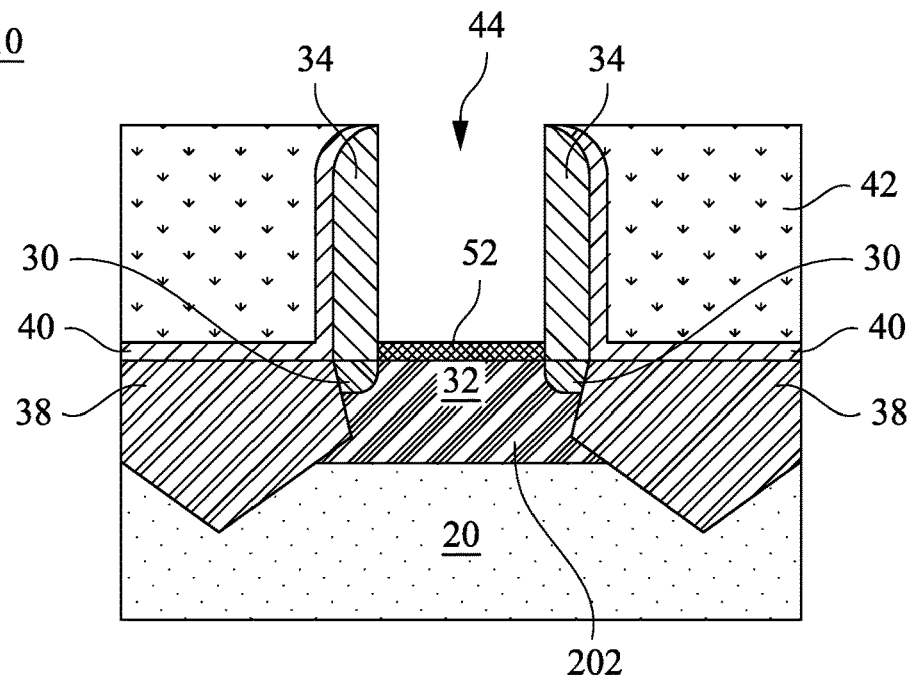

FIGS. 7 through 12 illustrate formation of a replacement gate stack. Reference is made to FIG. 7. An interfacial layer 52 is formed over the channel region 32. The interfacial layer 52 is used in order to arrange a good interface between the $Si_{1-x}Ge_x$ layer 202 and the gate insulator, especially with high-k dielectrics (e.g. $HfO_2$, $HfSiO_4$, $ZrO_2$, $ZrSiO_4$, etc.), and to suppress the mobility degradation of the channel carrier of the metal-oxide-semiconductor field-effect transistors (MOSFETs). Chemical oxide prepared by diluted HF, Standard Clean 1 (SC1), and Standard Clean 2 (SC2), plasma oxidation, ozonated deionized water treatment, rapid thermal oxidation (RTO), or the like may be used to form the interfacial layer 52 in the replacement gate stack. For example, ozonated oxide can be grown by high ozone gas, either in gas phase or pre-dissolved in de-ionized (DI) water. In some embodiments, the interfacial layer 52 is in contact with the channel region 32.

After the oxidation of the $Si_{1-x}Ge_x$ layer 202, a thin film of interfacial layer 52 is formed on the surface of the channel region 32. The interfacial layer 52 includes silicon oxide ($SiO_y$, in which y is larger than 0) and germanium oxide ($GeO_y$, in which y is larger than 0). The proportion of germanium oxide in the interfacial layer 52 resulting from the oxidation treatment is highly dependent on the germanium content in the $Si_{1-x}Ge_x$ layer 202 over the semiconductor substrate 20. The higher is the germanium content in the $Si_{1-x}Ge_x$ layer 202, the higher is the germanium oxide content of the interfacial layer 52. The lower is the germanium content in the $Si_{1-x}Ge_x$ layer 202, the lower is the germanium oxide content of the interfacial layer 52. Germanium oxide is harmful to the quality of the interfacial layer formed on the $Si_{1-x}Ge_x$ channel region. The harm to the channel region is evidenced by the increase in charged interface states. The harm to the channel region is also evidenced by the decrease in mobility with increasing amounts of germanium oxide in the interfacial layer. Accordingly, described herein are methods to scavenge or remove the germanium oxide from the interfacial layer 52 including germanium oxide and silicon oxide that is formed on the $Si_{1-x}Ge_x$ layer 202. In some embodiments, the germanium oxide is substantially removed from the interfacial layer 52, leaving silicon oxide remaining. In other embodiments, after a scavenging step, the residual germanium oxide is less than 5%, for example.

Figure 8:
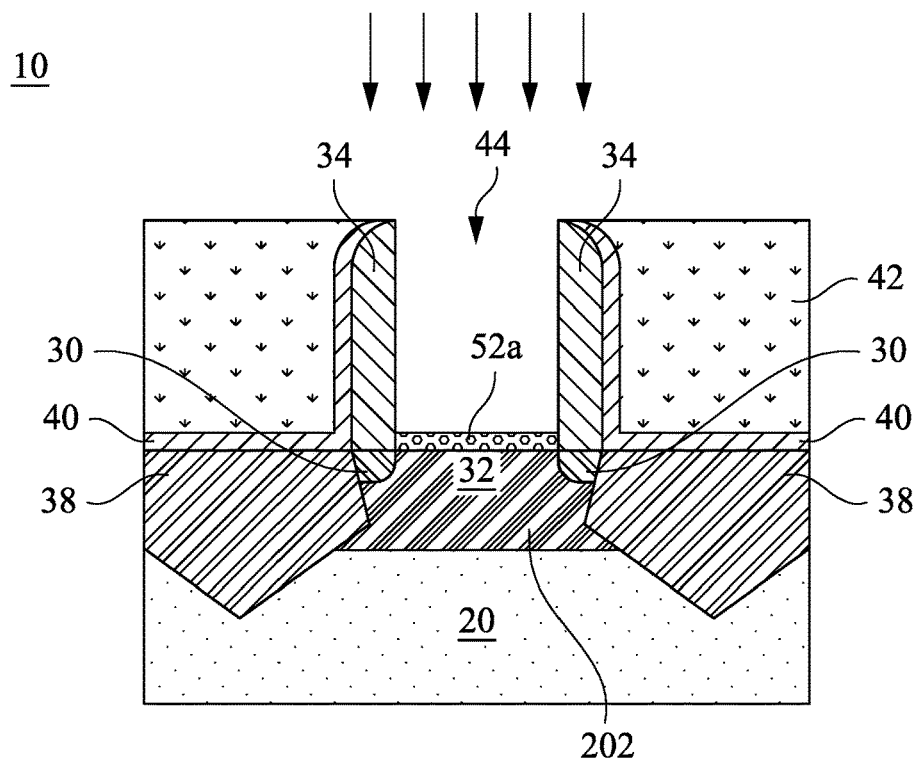

Reference is made to FIG. 8. The removal of germanium oxide from the interfacial layer 52 by the scavenging step is described below. The unnumbered arrows show a thermal annealing treatment to the wafer 10. A first stage of the scavenging step is carried out by heating the wafer 10 at a temperature of from about 500° C. to about 900° C. for about 1 minute. If the heating temperature is lower than 500° C., the germanium oxide cannot be completely removed from the inter facial layer 52. If the heating temperature is higher than 900° C., source and drain degradation or interface roughness may occur. This thermal annealing is conducted in an atmosphere of from about 1 Torr to about 760 Torr. The thermal annealing treatment is conducted in substantially oxygen-free condition with inert gas, for example $N_2$ to prevent oxidation. The scavenging step is effective because the germanium-oxygen bond in germanium oxide is much weaker than both the silicon-oxygen bond in silicon oxide and the silicon-germanium bond in the $Si_{1-x}Ge_x$ layer 202. Accordingly, germanium oxide is easily removed, leaving silicon oxide remaining within the interfacial layer 52a on the $Si_{1-x}Ge_x$ layer 202. The first stage of the scavenging step removes a large portion of the germanium oxide of the interfacial layer 52 before the wafer 10 is transferred to the atomic layer deposition (ALD) reaction chamber.

Figure 9:
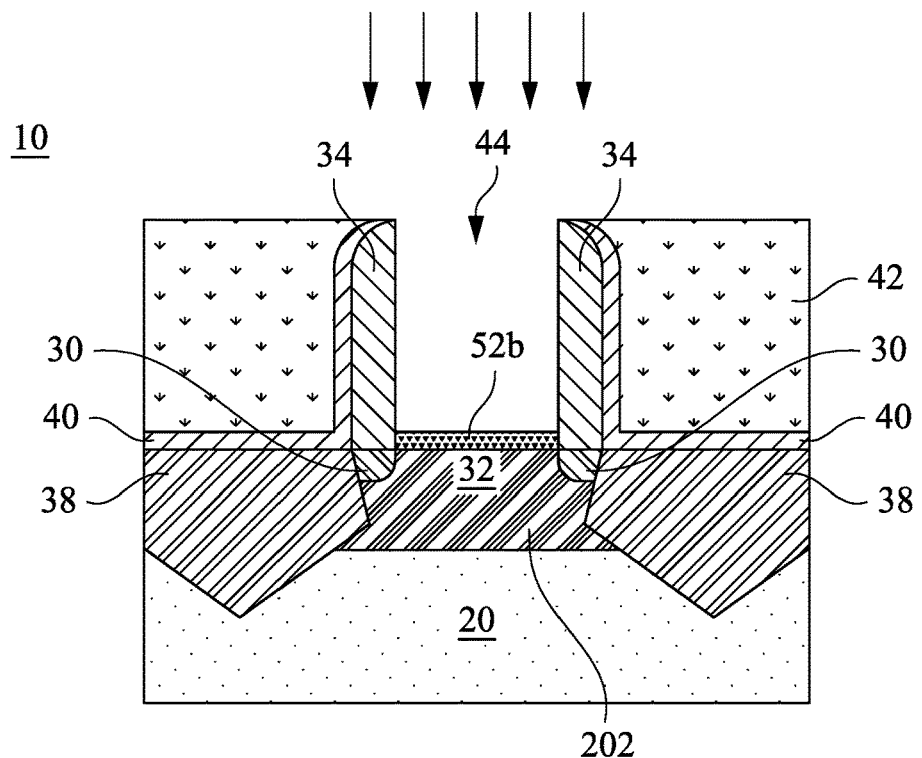

Reference is made to FIG. 9. The removal of germanium oxide from the interfacial layer 52a continues to a second stage. The unnumbered arrows show a trimethyl aluminum (TMA) pretreatment to the wafer 10 in-situ. The TMA pretreatment is conducted in substantially oxygen-free condition. After the first stage of germanium oxide scavenging step, the wafer 10 is transferred to an ALD reaction chamber (not shown), preparing for high-k dielectric layer deposition. Before the deposition of the high-k dielectric layer, the wafer 10 undergoes a TMA pretreatment in the ALD reaction chamber. TMA is a strong reductant, and TMA precursor is provided for about 30 seconds. The TMA pretreatment is carried out at a temperature of from about 150° C. to about 300° C. This TMA pretreatment is a consecutive process before the high-k dielectric layer deposition by ALD, and the reaction conditions of the TMA pretreatment is similar to the ALD reaction conditions of high-k dielectric layer deposition. The flow rate of TMA precursor is in a range from about 200 sccm to about 600 sccm. A flow rate lower than 200 sccm may result in incomplete removal of the germanium oxide. An atmosphere is chosen depending on the flow rate. In some embodiments, the atmosphere during TMA pretreatment ranges from about 1 Torr to about 25 Torr. The remaining germanium oxide in the interfacial layer 52a is then removed by the TMA pretreatment. In some embodiments, the thermal annealing treatment and the TMA pretreatment are conducted in different chambers.

Figure 19A:
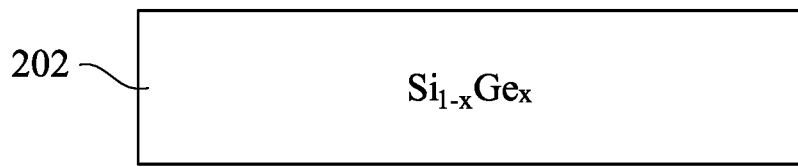
FIGS. 19A through 19D are cross-sectional views of a portion of a semiconductor device in an interfacial layer treatment process in accordance with some embodiments of the instant disclosure.
Figure 19B:
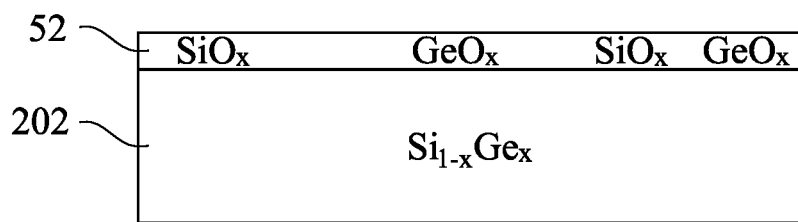
Figure 19C:
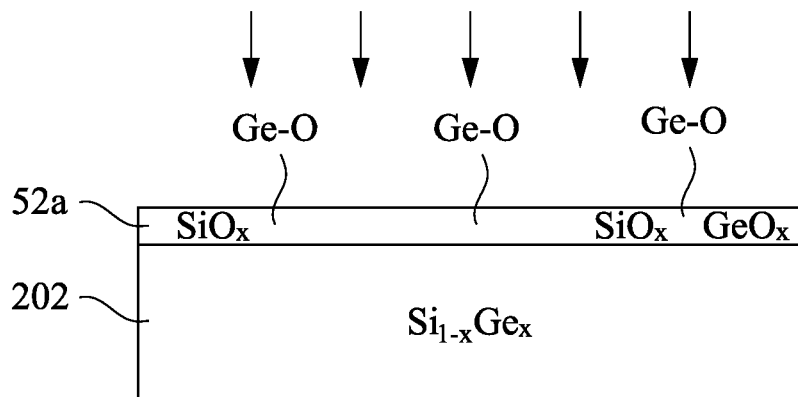
Figure 19D:
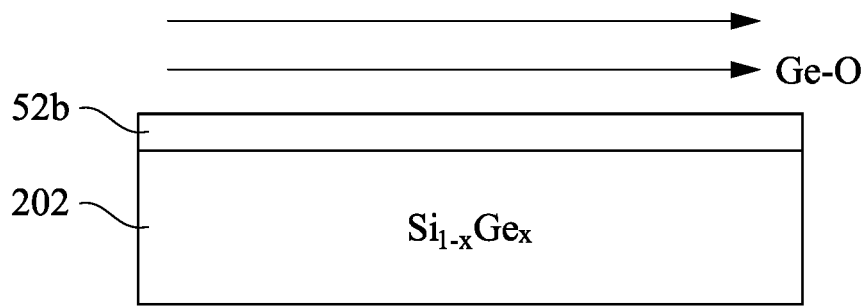

Reference is made to FIGS. 19A through 19D, illustrating schematic diagrams of germanium oxide scavenging step. As shown in FIG. 19A, a silicon germanium ($Si_{1-x}Ge_x$) layer 202 is formed. An interfacial layer 52 is formed on the silicon germanium layer 202 by oxidation step shown in FIG. 19B. The interfacial layer 52 includes silicon oxide and germanium oxide, and the amount of silicon oxide and germanium oxide depends on the silicon germanium ratio of the silicon germanium layer 202. As shown in FIG. 19C, the unnumbered arrows show the first stage of germanium oxide scavenging in which thermal annealing treatment breaks germanium and oxygen bonding so as to remove germanium oxide from the interfacial layer 52. Silicon oxide remains as a component of the interfacial layer 52a. As shown in FIG. 19D, TMA pretreatment is then performed to remove remaining germanium oxide from the interfacial layer 52a. The TMA pretreatment is conducted in-situ of high-k dielectric layer ALD process. The wafer 10 does not need to be transferred to a different chamber for TMA pretreatment which simplifies the fabrication process. The thickness of the interfacial layer 52 remains relatively unchanged.

Figure 10:
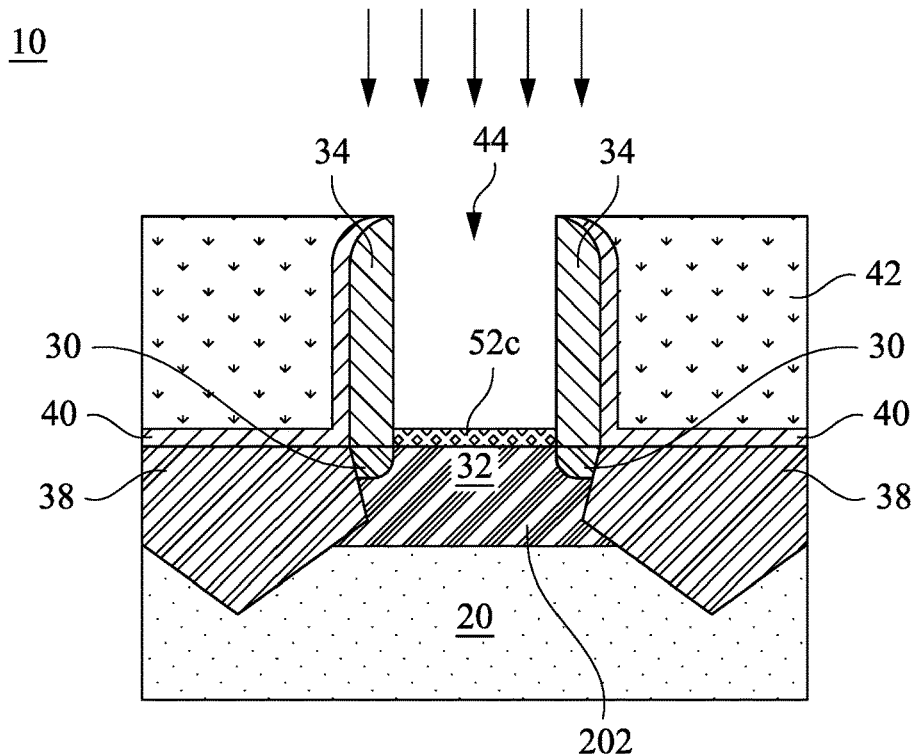

Reference is made to FIG. 10. In some embodiments, before the deposition of the high-k dielectric layer, an in-situ nitridation treatment is performed. The nitridation treatment is performed in the ALD reaction chamber. The unnumbered arrows show the nitridation process. Germanium oxide is removed by the two-stage scavenging step including thermal annealing and TMA pretreatment. The remaining silicon oxide of the interfacial layer 52b is converted into silicon oxynitride ($SiO_aN_b$) by the nitridation treatment with a nitrogen containing agent, in which a and b is larger than 0. The nitridation treatment includes, for example, $NH_3$ plasma in plasma enhanced ALD (PEALD) for about 5 to 30 seconds, $N_2$ plasma in PEALD for about 5 to 30 seconds, or $NH_3$ gas annealing in ALD at about 300° C. to 500° C. for about 1 minute. If the duration of the plasma treatment is shorter than 5 seconds, the effect of nitridation may be insufficient, resulting in germanium oxide formation in the subsequent process. If the duration of the plasma treatment is longer than 30 seconds, the plasma intensity may damage the interfacial layer 52b. If the temperature of $NH_3$ gas annealing is lower than 300° C., the nitridation on the interfacial layer 52b may not occur, and the time duration allows sufficient silicon oxynitride formation. This nitridation treatment further prevents the germanium of the $Si_{1-x}Ge_x$ layer 202 out-diffusion. The interfacial layer 52c is then a nitrogen-containing layer, e.g. a silicon oxynitride layer, that covers the channel region 32 of the $Si_{1-x}Ge_x$ layer 202.

In some embodiments, the nitridation treatment may extend to an interface between the interfacial layer 52c and the $Si_{1-x}Ge_x$ layer 202. This prevents the germanium of the $Si_{1-x}Ge_x$ layer 202 from out-diffusion. This also avoids the interfacial layer 52c from having an untreated portion. Such an untreated portion increases an effective oxide thickness (EOT) of the gate stack, resulting in a low gate control ability for a device. In some embodiments, the nitridated interfacial layer 52c includes nitrogen therein, and the thickness of the nitridated interfacial layer 52c is in a range from about 5 Å to about 10 Å. If the thickness of the nitridated interfacial layer 52c is less than about 5 Å, the nitridated interfacial layer 52c may not be thick enough to prevent the germanium of the $Si_{1-x}Ge_x$ layer 202 from out-diffusion, resulting in germanium oxide formation in the subsequent processes. On the other hand, if the nitridated interfacial layer 52c is greater than about 10 Å, the EOT of the gate stack may be too thick, resulting also in a low gate control ability for the device.

In some embodiments, the temperature of the semiconductor substrate 20 during the nitridation treatment is in a range from about 300° C. to about 1000° C. If the temperature of the semiconductor substrate 20 during the nitridation treatment is lower than about 300° C., the effect of nitridation may be insufficient, resulting in germanium oxide formation in the subsequent processes. If the temperature of the semiconductor substrate 20 is greater than about 1000° C., the nitridation treatment may affect the underlying $Si_{1-x}Ge_x$ layer 202, resulting in the increase of the effective oxide thickness (EOT) of the gate stack, which causes a low gate control ability for a device.

In some embodiments, the plasma power of the nitridation treatment is in a range from about 50 w to about 650 w. If the plasma power of the nitridation treatment is lower than about 50 w, the effect of nitridation may be insufficient, resulting in germanium oxide formation in the subsequent processes. If the plasma power of the nitridation treatment is greater than about 650 w, the nitridation treatment may affect the underlying $Si_{1-x}Ge_x$ layer 202, resulting in the increase of the effective oxide thickness (EOT) of the gate stack, which causes a low gate control ability for a device.

Figure 11:
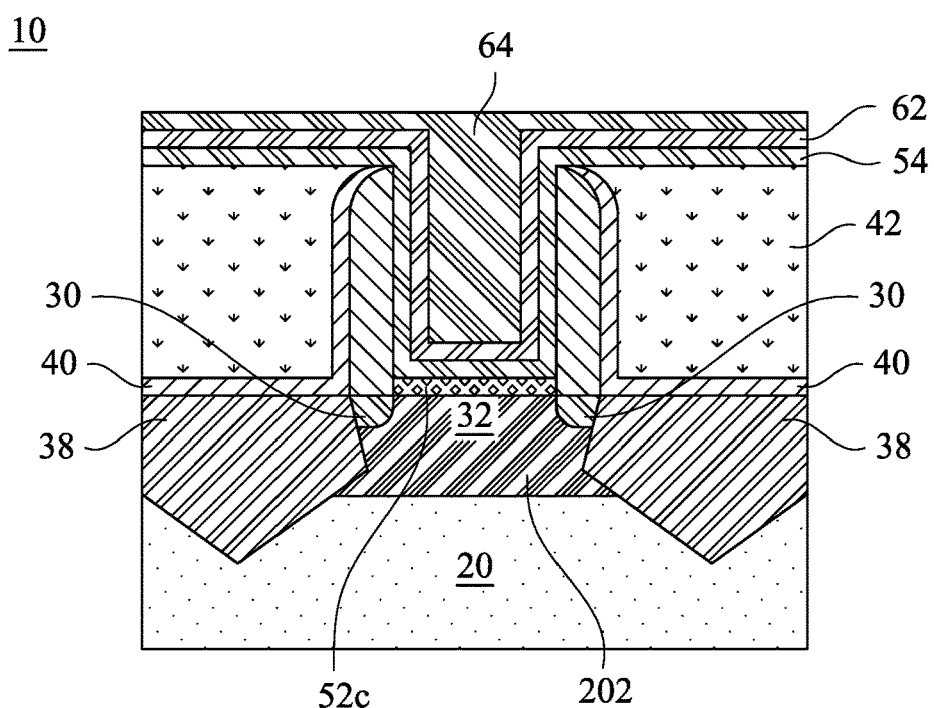

Reference is made to FIG. 11. A high-k dielectric layer 54 is formed. The high-k dielectric layer 54 includes a high-k dielectric material such as hafnium oxide, lanthanum oxide, aluminum oxide, or the like. The dielectric constant (k-value) of the high-k dielectric material is higher than 3.9, and may be higher than about 7, and sometimes as high as 21 or higher. The high-k dielectric layer 54 is overlying the interfacial layer 52c. The formation of the high-k dielectric layer 54 is performed in the ALD reaction chamber. A work function metal layer 62 is formed on the high-k dielectric layer 54. The work function metal layer 62 may include titanium aluminum (TiAl) in accordance with some embodiments. In some embodiments, a barrier layer (not shown) is interposed between the work function metal layer 62 and the high-k dielectric layer 54. The barrier layer may include TiN, TaN, or composite thereof. For example, the barrier layer may include a TiN layer (the lower part of barrier layer), and a TaN layer (the upper part of barrier layer) over the TiN layer.

Reference is still made to FIG. 11. In some embodiments, the subsequently formed metal layers may include a block layer (not shown), a wetting layer (not shown), and a metal gate electrode 64. The block layer may include TiN, and the wetting layer may be a cobalt layer. The metal gate electrode 64 may include tungsten, a tungsten alloy, aluminium, an aluminum alloy, or the like.

Figure 12:
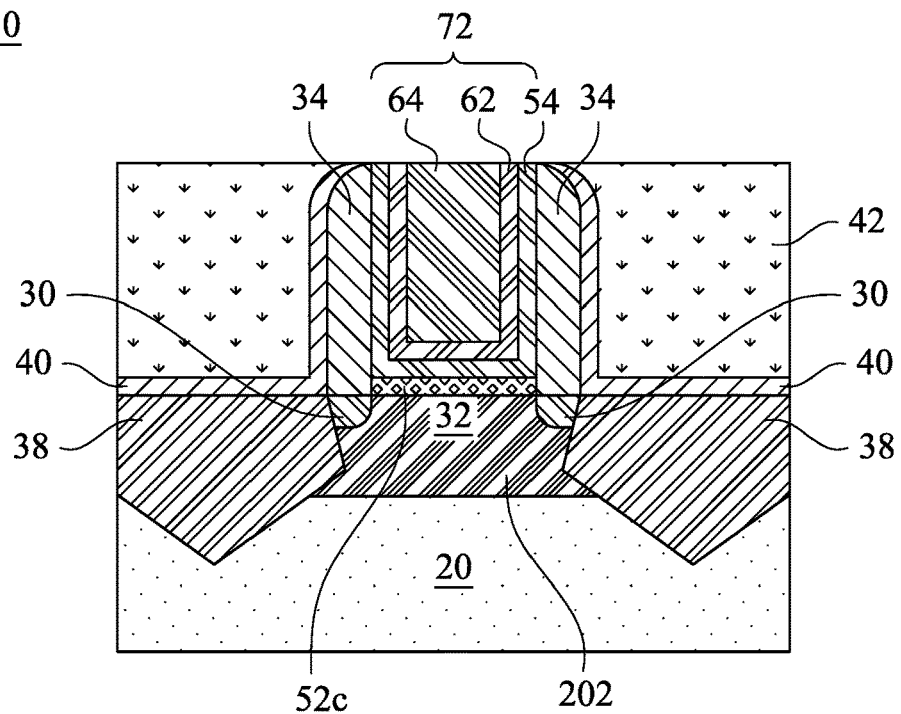

Reference is made to FIG. 12, illustrating a planarization step. The planarization step may be, for example, CMP for removing excess portions of the high-k dielectric layer 54, work function metal layer 62, and metal gate electrode 64 over the interlayer dielectric layer 42. The interfacial layer 52c, high-k dielectric layer 54, work function metal layer 62 and metal gate electrode 64 form the replacement gate stack 72.

The replacement gate stack 72 has a nitrogenous interfacial layer 52c interposed between the high-k dielectric layer 54 and the $Si_{1-x}Ge_x$ layer 202. The interfacial layer 52c undergoes the thermal annealing and the TMA pretreatment and further to the nitridation process. These processes ensure germanium oxide desorption from the interfacial layer 52c and therefore maintains a lower interface state density ($D_{it}$) at the interface between the interfacial layer 52c and the $Si_{1-x}Ge_x$ layer 202. A lower $D_{it}$ is less likely to flatten on-off switch curve and allows higher electron mobility at the channel region. An epitaxial process to treat the $Si_{1-x}Ge_x$ layer 202 surface can be omitted because the series of interfacial layer treatment minimizes dangling bonds thereon. Without the addition of an epitaxial cap on the channel region, scaling of the channel body can be realized especially in devices like ultrathin body SiGe-OI (Silicon Germanium on Insulator) FET, FinFET, nano-wire FET and the like.

Figure 13:
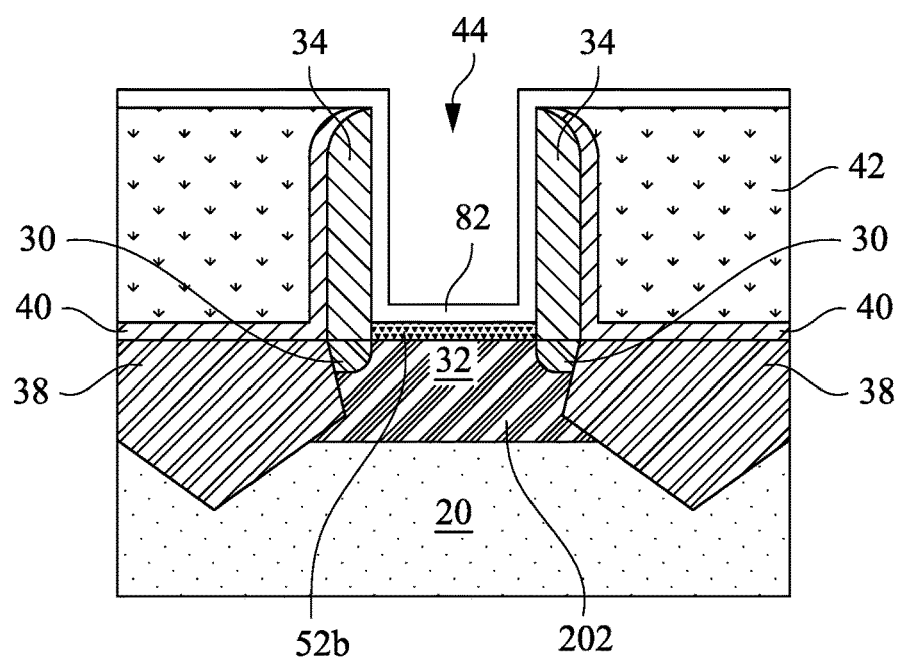
Figure 14:
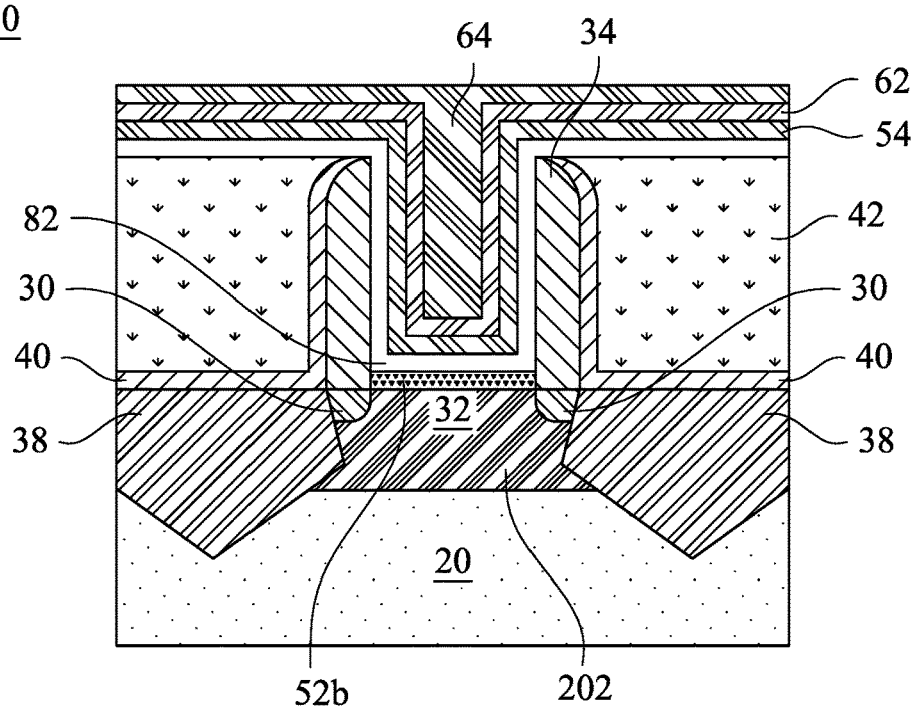
Figure 15:
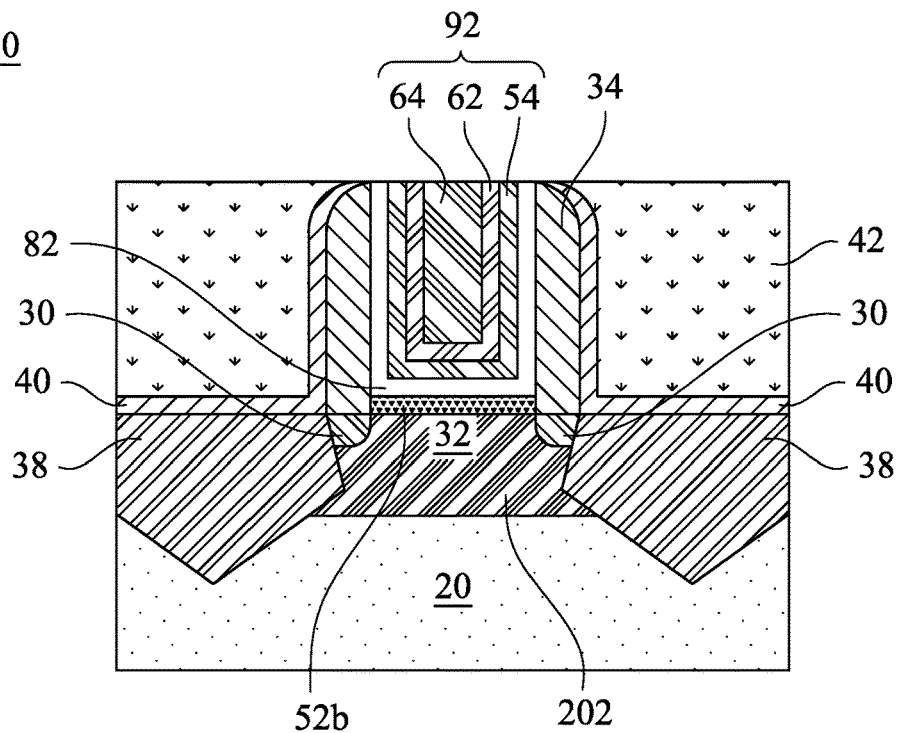

FIGS. 13 through 15 illustrate the formation of a replacement gate stack in some embodiments. Reference is made to FIG. 13, illustrating formation of a high-k passivation layer 82. After the dummy gate stack 22 is removed and the recess 44 is created as described through FIGS. 2-6, the interfacial layer 52 goes through a series of treatments including thermal annealing and in-situ TMA pretreatment as shown in FIGS. 7-9. The wafer 10 is in the ALD reaction chamber when the TMA precursor is introduced to the reaction chamber prior to high-k dielectric layer deposition. After the annealing and TMA pretreatment, the germanium oxide is readily removed from the interfacial layer 52b, leaving silicon oxide as the key component in the interfacial layer 52b. In some embodiments, the interfacial layer nitridation is omitted in the process. Alternatively, a high-k passivation layer 82 is formed on the interfacial layer 52b that goes through thermal annealing and TMA pretreatment.

The high-k passivation layer 82 is formed by ALD prior to high-k dielectric layer deposition in the same ALD reaction chamber. The high-k passivation layer 82 conforms to the replacement gate recess 44, in which the sidewalls of the spacers 34 and the top surface of the interfacial layer 52b are covered up thereby. The high-k passivation layer 82 reacts with the interfacial layer 52b. Therefore, the high-k passivation layer 82 includes, for example, high-k silicate, germanate, or combinations thereof in its bottom portion. The concentration of the high-k silicate or germanate in the high-k passivation layer 82 decreases as a distance from the interfacial layer 52b increases. Examples of high-k materials in the high-k passivation layer 82 may be $Al_2O_3$, $La_2O_3$, $Y_2O_3$, or combinations thereof. This high-k passivation layer 82 prevents germanium of the $Si_{1-x}Ge_x$ layer 202 out-diffusion. A thickness of the high-k passivation layer 82 may range between about 5 and 10 Å.

In some embodiments, the thickness of the high-k passivation layer 82 is in a range from about 5 Å to about 10 Å. If the thickness of the high-k passivation layer 82 is less than about 5 Å, the high-k passivation layer 82 may not be thick enough to prevent the germanium of the $Si_{1-x}Ge_x$ layer 202 from out-diffusion, resulting in germanium oxide formation in the subsequent processes. If the thickness of the high-k passivation layer 82 is greater than about 10 Å, the effective oxide thickness (EOT) of the gate stack may be too thick, resulting in a low gate control ability for a device.

Reference is made to FIG. 14. The high-k dielectric layer 54 is formed on the high-k passivation layer 82. The high-k dielectric layer 54 includes a high-k dielectric material such as hafnium oxide, lanthanum oxide, aluminum oxide, or the like. The formation of the high-k dielectric layer 54 is performed in the ALD reaction chamber. The high-k passivation layer 82 is interposed between the high-k dielectric layer 54 and the interfacial layer 52b. Unlike the embodiment shown in FIG. 11, the high-k dielectric layer 54 is spaced apart from the interfacial layer 52b because of the insertion of the high-k passivation layer 82. The work function metal layer 62 is formed on the high-k dielectric layer 54. The work function metal layer 62 may include titanium aluminum (TiAl) in accordance with some embodiments.

Reference is still made to FIG. 14. In some embodiments, the subsequently formed metal layers may include a block layer (not shown), a wetting layer (not shown), and a metal gate electrode 64. The block layer may include TiN, and the wetting layer may be a cobalt layer. The metal gate electrode 64 may include tungsten, a tungsten alloy, aluminium, an aluminium alloy, or the like.

Reference is made to FIG. 15, illustrating a planarization step. The planarization step may be, for example, CMP for removing excess portions of the high-k passivation layer 82, high-k dielectric layer 54, work function metal layer 62, and metal gate electrode 64 over the interlayer dielectric layer 42. The interfacial layer 52b, high-k passivation layer 82, high-k dielectric layer 54, work function metal layer 62, and metal gate electrode 64 form the replacement gate stack 92.

The replacement gate stack 92 has the high-k passivation layer 82 interposed between the interfacial layer 52b and the high-k dielectric layer 54. The interfacial layer 52b undergoes thermal annealing and TMA pretreatment so as to remove the dangling bond thereon, and the high-k passivation layer 82 prevents germanium out-diffusion from the $Si_{1-x}Ge_x$ layer 202. These processes ensure a germanium oxide free interfacial layer 52b and the germanium from the $Si_{1-x}Ge_x$ layer 202 is confined therewithin. A lower $D_{it}$ can therefore be maintained at the interface between the interfacial layer 52b and the $Si_{1-x}Ge_x$ layer 202. A lower $D_{it}$ is less likely to flatten on-off switch curve and allows higher electron mobility at the channel region. Even without the addition of an epitaxial cap on the channel region, germanium oxide is removed and the remaining free germanium does not diffuse out of the $Si_{1-x}Ge_x$ layer 202.

Figure 16:
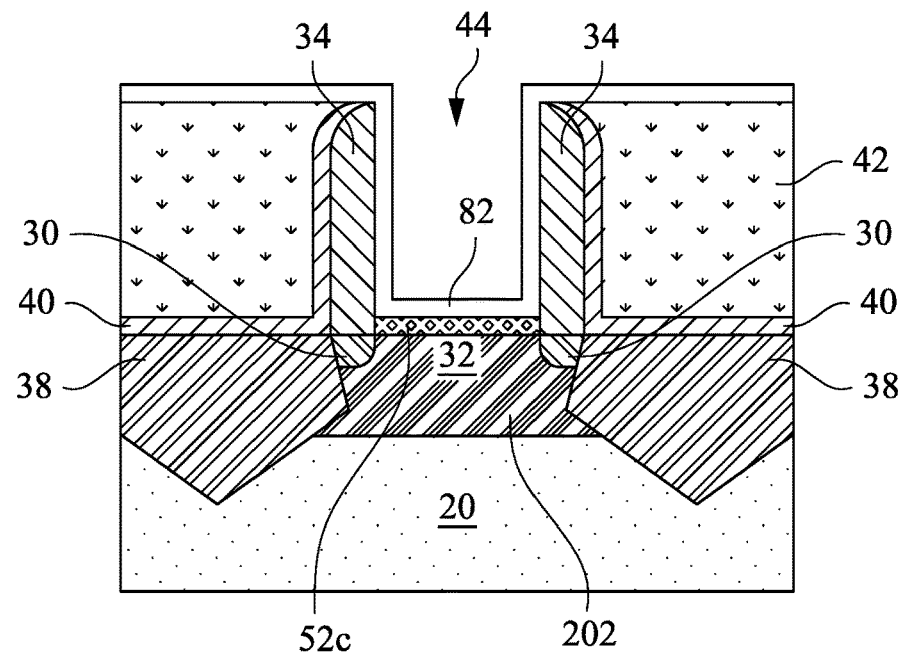

Reference is made to FIG. 16. In some embodiments, after the in-situ nitridation treatment is performed (see FIG. 10), the high-k passivation layer 82 is formed on the interfacial layer 52c which is a silicon oxynitride layer. The formation of the high-k passivation layer 82 is performed in the ALD reaction chamber. The interfacial layer 52c overlies the channel region 32, and the high-k passivation layer 82 overlies the interfacial layer 52c. The high-k passivation layer 82 conforms to the replacement gate recess 44, in which the sidewalls of the spacers 34 and the top surface of the interfacial layer 52c are covered up thereby. The high-k passivation layer 82 reacts with the interfacial layer 52c. Therefore, the high-k passivation layer 82 includes, for example, high-k silicate, germanate, or combinations thereof in its bottom portion which overlies the interfacial layer 52c. The concentration of the high-k silicate or germinate in the high-k passivation layer 82 decreases as a distance from the interfacial layer 52c increases. Examples of high-k materials in the high-k passivation layer 82 may be $Al_2O_3$, $La_2O_3$, $Y_3O_3$, or combinations thereof. This high-k passivation layer 82 prevents germanium of the $Si_{1-x}Ge_x$ layer 202 out-diffusion. A thickness of the high-k passivation layer 82 may range between about 5 and 10 Å.

Figure 17:
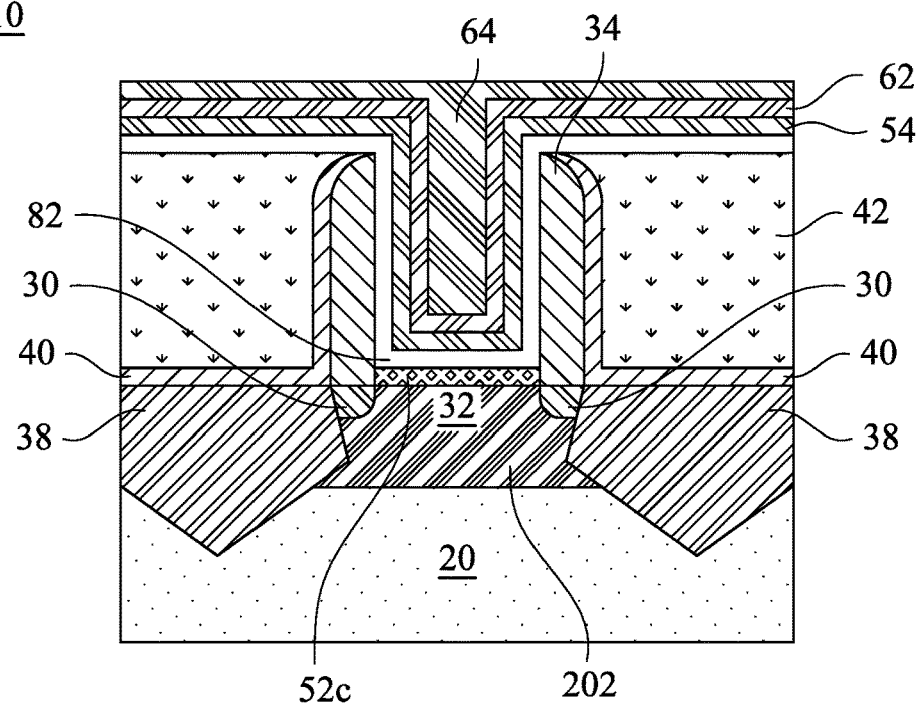

Reference is made to FIG. 17. A high-k dielectric layer 54 is formed. The high-k dielectric layer 54 includes a high-k dielectric material such as hafnium oxide, lanthanum oxide, aluminum oxide, or the like. The formation of the high-k dielectric layer 54 is performed in the ALD reaction chamber. The dielectric constant (k-value) of the high-k dielectric material is higher than 3.9, and may be higher than about 7, and sometimes as high as 21 or higher. The high-k dielectric layer 54 is overlying the high-k passivation layer 82. A work function metal layer 62 is formed on the high-k dielectric layer 54. The work function metal layer 62 may include titanium aluminum (TiAl) in accordance with some embodiments. In some embodiments, a barrier layer (not shown) is interposed between the work function metal layer 62 and the high-k dielectric layer 54. The barrier layer may include TiN, TaN, or composite thereof. For example, the barrier layer may include a TiN layer (the lower part of barrier layer), and a TaN layer (the upper part of barrier layer) over the TiN layer.

Reference is still made to FIG. 17. In some embodiments, the subsequently formed metal layers may include a block layer (not shown), a wetting layer (not shown), and a metal gate electrode 64. The block layer may include TiN, and the wetting layer may be a cobalt layer. The metal gate electrode 64 may include tungsten, a tungsten alloy, aluminium, an aluminum alloy, or the like.

Figure 18:
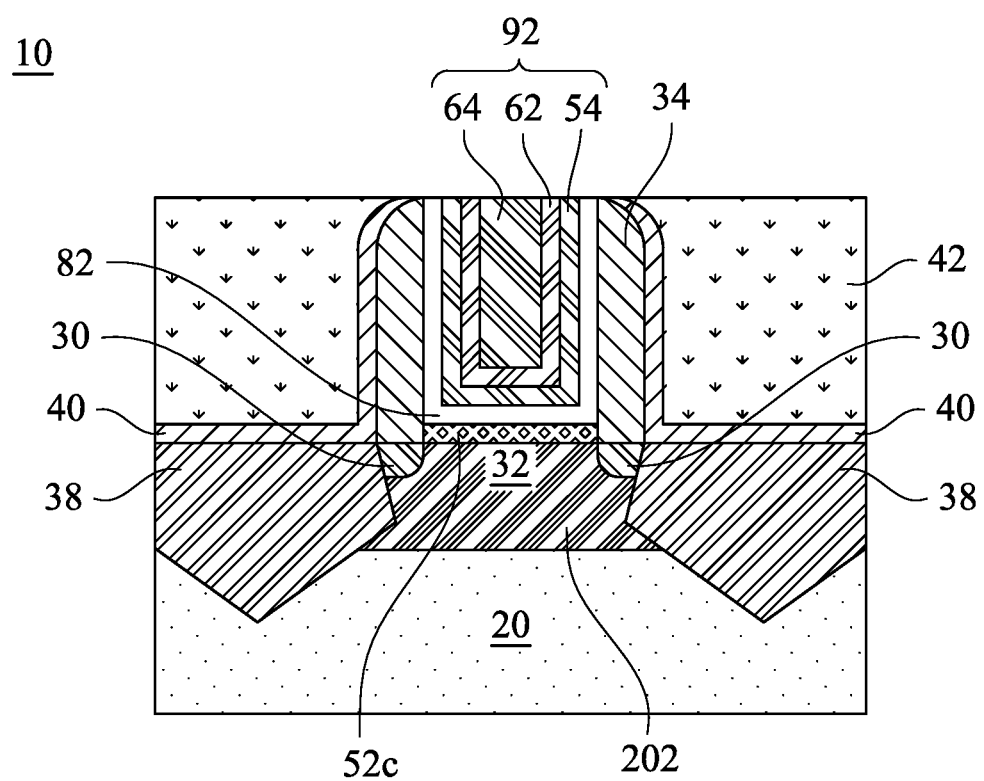

Reference is made to FIG. 18, illustrating a planarization step. The planarization step may be, for example, CMP for removing excess portions of the high-k passivation layer 82, high-k dielectric layer 54, work function metal layer 62, and metal gate electrode 64 over the interlayer dielectric layer 42. The interfacial layer 52c, high-k passivation layer 82, high-k dielectric layer 54, work function metal layer 62 and metal gate electrode 64 form the replacement gate stack 92.

The replacement gate stack 92 has a nitrogenous interfacial layer 52c and a high-k passivation layer 82 interposed between the interfacial layer 52c and the high-k dielectric layer 54. The interfacial layer 52c undergoes thermal annealing and TMA pretreatment so as to remove the dangling bond thereon. The interfacial layer 52c prevents germanium out-diffusion from the $Si_{1-x}Ge_x$ layer 202, and the high-k passivation layer 82 is the second barrier against germanium out-diffusion. Remaining germanium is securely locked in the $Si_{1-x}Ge_x$ layer 202 because of the interfacial layer 52c and the high-k passivation layer 82. A lower $D_{it}$ can therefore be maintained at the interface between the interfacial layer 52c and the $Si_{1-x}Ge_x$ layer 202. A lower $D_{it}$ is less likely to flatten on-off switch curve and allows higher electron mobility at the channel region 32.

The interfacial layer is firstly annealed to remove germanium oxide after the interfacial layer formation. Subsequently, TMA pretreatment that involves using TMA precursor onto the interfacial layer is performed. The TMA pretreatment further removes remaining germanium oxide from the interfacial layer. The interfacial layer then may go through nitridation to form a silicon oxynitride layer. Alternatively, a high-k passivation layer may be formed on the interfacial layer. Either the nitridation process or the high-k passivation layer prevents germanium out-diffusion from the $Si_{1-x}Ge_x$ layer. Due to the removal of germanium oxide and germanium out-diffusion blockage, $D_{it}$ can be achieved at the interface between the interfacial layer and the $Si_{1-x}Ge_x$ layer, and therefore the channel region has a higher electron mobility.

In some embodiments, a semiconductor device includes a source region, a drain region, a SiGe channel region, an interfacial layer, a high-k dielectric layer and a gate electrode. The source region and the drain region are over a substrate. The SiGe channel region is laterally between the source region and the drain region. The interfacial layer forms a nitrogen-containing interface with the SiGe channel region. The high-k dielectric layer is over the interfacial layer. The gate electrode is over the high-k dielectric layer.

In some embodiments, a semiconductor device includes a SiGe layer, a source region, a drain region, a nitrogen-containing interfacial layer, a gate dielectric layer, and a gate electrode. The SiGe layer is over a substrate. The source region and the drain region are over the substrate. At least a portion of the SiGe layer extends laterally between the source region and the drain region. The nitrogen-containing interfacial layer is over the at least a portion of the SiGe layer. The gate dielectric layer is over the nitrogen-containing interfacial layer. The gate electrode is over the gate dielectric layer.

In some embodiments, a semiconductor device includes a plurality of gate spacers, a silicon oxynitride layer, a high-k dielectric layer and a gate electrode. The gate spacers are over a p-type field-effect transistor (PFET) channel region. The silicon oxynitride layer is laterally between the gate spacers and in contact with the PFET channel region. The high-k dielectric layer is over the silicon oxynitride layer. The high-k dielectric layer has a U-shaped profile different from a profile of the silicon oxynitride layer from a cross-sectional view. The gate electrode is over the high-k dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a silicon germanium layer on a substrate;
    oxidizing a surface layer of the silicon germanium layer to form an interfacial layer comprising silicon oxide and germanium oxide;
    nitridating the interfacial layer; and
    forming a metal gate structure over the nitridated interfacial layer.

2. The method of claim 1, wherein the interfacial layer is nitridated using an $NH_3$ plasma.

3. The method of claim 1, wherein the interfacial layer is nitridated using an $N_2$ plasma.

4. The method of claim 1, wherein the interfacial layer is nitridated using a plasma treatment performed for five seconds to thirty seconds.

5. The method of claim 1, wherein the interfacial layer is nitridated by performing an annealing process in a $NH_3$ gas.

6. The method of claim 5, wherein the annealing process is performed at a temperature in a range from 300° C. to 500° C.

7. The method of claim 1, further comprising:
    performing an annealing process on the interfacial layer before nitridating the interfacial layer.

8. The method of claim 1, further comprising:
    performing a trimethyl aluminum (TMA) treatment on the interfacial layer before nitridating the interfacial layer.

9. The method of claim 1, further comprising:
    performing an annealing process on the interfacial layer; and
    after performing the annealing process, performing a trimethyl aluminum (TMA) treatment on the interfacial layer, wherein the interfacial layer is nitridated after performing the TMA treatment.

10. A method comprising:
    epitaxially growing a silicon germanium layer on a substrate;
    performing an oxidation treatment to form an oxide layer of silicon germanium on the silicon germanium layer;
    performing a germanium oxide desorption treatment on the oxide layer to reduce a ratio of germanium oxide to silicon oxide in the oxide layer;
    after performing the germanium oxide desorption treatment, nitridating the oxide layer; and
    forming a metal gate structure over the nitridated oxide layer.

11. The method of claim 10, wherein the germanium oxide desorption treatment is a thermal annealing treatment.

12. The method of claim 11, wherein the thermal annealing treatment is performed at a temperature in a range from 500° C. to 900° C.

13. The method of claim 11, wherein the thermal annealing treatment is performed in an oxygen-free ambient.

14. The method of claim 10, further comprising:
    performing a trimethyl aluminum (TMA) treatment on the oxide layer.

15. The method of claim 14, wherein the TMA treatment is performed after performing the germanium oxide desorption treatment.

16. A method comprising:
    forming a layer of semiconductor alloy of silicon and germanium on a substrate;
    oxidizing a surface portion of the layer of semiconductor alloy;
    treating the oxidized portion of the layer of semiconductor alloy with trimethyl aluminum (TMA);
    nitridating the oxidized portion of the layer of semiconductor alloy; and
    after nitridating the oxidized portion of the layer of semiconductor alloy, forming a metal gate structure over the oxidized portion of the layer of semiconductor alloy.

17. The method of claim 16, further comprising:
    after nitridating the oxidized portion of the layer of semiconductor alloy, forming a high-k silicate layer over the oxidized portion of the layer of semiconductor alloy.

18. The method of claim 16, further comprising:
    after nitridating the oxidized portion of the layer of semiconductor alloy, forming a high-k germanate layer over the oxidized portion of the layer of semiconductor alloy.

19. The method of claim 16, wherein nitridating the oxidized portion of the layer of semiconductor alloy is in-situ performed with treating the oxidized portion of the layer of semiconductor alloy with trimethyl aluminum (TMA).

20. The method of claim 16, wherein treating the oxidized portion of the layer of semiconductor alloy with trimethyl aluminum (TMA) is performed at a flow rate of a TMA precursor in a range from 200 sccm to 600 sccm.

* * * * *